(12) United States Patent
Burch et al.

(10) Patent No.: US 11,972,987 B2
(45) Date of Patent: Apr. 30, 2024

(54) DIE LEVEL PRODUCT MODELING WITHOUT DIE LEVEL INPUT DATA

(71) Applicant: PDF Solutions, Inc., Santa Clara, CA (US)

(72) Inventors: Richard Burch, McKinney, TX (US); Qing Zhu, Rowlett, TX (US); Jonathan Holt, Sachse, TX (US)

(73) Assignee: PDF Solutions, Inc., Santa Clara, CA (US)

( * ) Notice: Subject to any disclaimer, the term of this patent is extended or adjusted under 35 U.S.C. 154(b) by 298 days.

(21) Appl. No.: 17/072,817

(22) Filed: Oct. 16, 2020

(65) Prior Publication Data

US 2021/0118754 A1    Apr. 22, 2021

Related U.S. Application Data

(60) Provisional application No. 62/916,163, filed on Oct. 16, 2019.

(51) Int. Cl.
*H01L 21/66* (2006.01)
*G06N 20/00* (2019.01)

(52) U.S. Cl.
CPC .............. *H01L 22/20* (2013.01); *G06N 20/00* (2019.01); *H01L 22/14* (2013.01)

(58) Field of Classification Search
None
See application file for complete search history.

(56) References Cited

U.S. PATENT DOCUMENTS

| | | | |
|---|---|---|---|
| 2015/0253373 A1* | 9/2015 | Callegari | H01L 22/20 702/58 |
| 2016/0313651 A1 | 10/2016 | Middlebrooks et al. | |
| 2018/0330493 A1* | 11/2018 | Milligan | G06K 9/6256 |
| 2019/0064253 A1* | 2/2019 | David | G06N 3/08 |
| 2020/0064275 A1 | 2/2020 | Chao et al. | |

OTHER PUBLICATIONS

Kang et al, "Using Wafer Map Features to Better Predict Die-Level Failures in Final Test", IEEE Transactions on Semiconductor Manufacturing, vol. 28, No. 3, Jun. 11, 2015 (Jun. 11, 2015), p. 431-437.
International Search Report and Written Opinion of the ISA dated Jan. 19, 2021.

* cited by examiner

*Primary Examiner* — Evren Seven
(74) *Attorney, Agent, or Firm* — Dergosits & Noah LLP

(57) ABSTRACT

A machine learning model for each die for imputing process control parameters at the die. The model is based on wafer sort parametric measurements at multiple test sites across the entire wafer, as well as yield results for the wafer. This allows for a better analysis of outlier spatial patterns leading to improved yield results.

12 Claims, 4 Drawing Sheets

DIE LEVEL PRODUCT MODELING WITHOUT DIE LEVEL INPUT DATA

CROSS REFERENCE

This application claims priority from U.S. Provisional Application No. 62/916,163 entitled Die Level Semiconductor Product Modeling without Die Level Input Data, filed Oct. 16, 2019, incorporated herein by reference in its entirety.

TECHNICAL FIELD

This application relates to modeling of semiconductor wafers, and more particularly, to modeling die level parameters.

BACKGROUND

It is very difficult to predict die level yield of semiconductor products for a variety of reasons. In previous generations, product yield was often defect limited and modeling die level yield required extensive optical defect data. Most efforts to model spatial patterns of yield or wafer sort parametric measurements with process control monitor (PCM) measurements focus on interpolating or extrapolating the PCM measurements to try and predict the PCM measurements at each wafer. To do this, electrical measurements of test structures on several wafers are taken as representative for a much larger group of wafers and then used to create a fixed parameter map. These efforts have generally been unsuccessful, since they could not account for the changing spatial patterns that are frequently responsible for bad wafers.

Further, due primarily to cost limitations, only a small percentage of wafers can be measured at each layer making die level prediction virtually impossible for most wafers. The yield of more recent generations is often driven more by parametric variation than defects, providing the opportunity to model yield directly from parametric measurements that can be performed on each die.

However, once again, cost provides an obstacle. Initial parametric measurements of scribe line structures, frequently known as either PCM or WAT (Wafer Acceptance Test) data, are normally performed at a limited number of sites, often only 5-10 sites, on each wafer. Predicting the wafer sort yield or wafer sort parametric on each die using PCM data is valuable, especially if the importance of each variable on each wafer can be specified. Since PCM measurements are well known to be correlated generally to parametric yield loss and wafer sort parametrics, many wafer level models have been successfully created using them to predict both wafer yield and mean value of parameters for each wafer. However, as noted, predicting yield at the die level is particularly difficult since the PCM measurements are normally available for only a few sites on the wafer. To predict die level yield, the most common approach is to impute the value of the PCM parameters at each die with interpolation or by fitting an assumed model form to the available PCM data. This has only been marginally successful due to the limited sites available and the uncertainty of the model forms for each PCM parameter.

Therefore, it would be desirable to predict the die yield or die level wafer sort parametric directly from the PCM parameters without the error associated with explicitly imputing the PCM parameter for each die.

BRIEF SUMMARY

A machine learning model is created for each die of a semiconductor wafer. Testing data is obtained from a plurality of testing sites distributed across the wafer. A die level map of the wafer is obtained. Based on the testing data and the die level map, each model is configured predict yield for its respective die, and to impute the process control parameters for the die.

DETAILED DESCRIPTION

Figure 1:
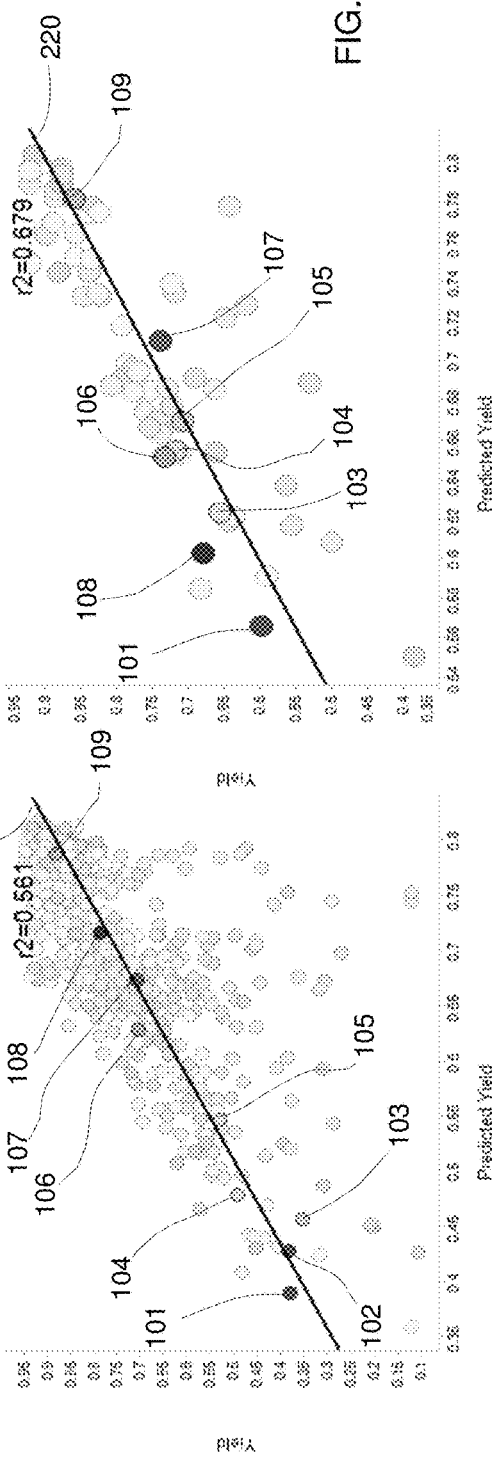
FIG. 1 is a graphical plot illustrating a wafer-level correlation between predicted yield and actual yield for a plurality of wafer samples.

A wafer is a thin slice of semiconductor material used for the fabrication of integrated circuits. Many identical circuits are commonly formed on the wafer on individual dies, and when fabrication is complete, the dies are sliced apart at scribe lines to separate the individual circuits for packaging. Any structures close to the scribe lines will be destroyed during this process, making that area useless for creating product circuitry. However, these scribe line spaces are ideal for creating test structures that will be measured before slicing the dies.

Prior to slicing the dies, a testing protocol, such as wafer acceptance testing (WAT) or process control monitoring (PCM), is performed on scribe line test structures formed at various test sites on the wafer. In one example, nine test sites are measured on a wafer. For understanding the variation across the wafer, it would be ideal to locate some of the test sites near the edge of the wafer. However, it is usually preferred to locate the test sites away from wafer edges to improve the quality of the measurements.

To improve die-level yield predictions, a separate processor-based model can be built for each die on the wafer using the testing data obtained from each test site as a separate input variable to the model. Further, models could be built on a per site basis, a per die basis, a per wafer basis and/or a per lot basis. Modern machine learning technologies can be used to configure algorithmic-based software models that learn the complex non-linear relationships, initially from training sets of data, and updated from newly acquired data, to continuously learn about the relationships among the parameters to yield performance. For example, a neural network is an example of an implementation of a machine learning model, and XGBoost is another machine learning model based on extremely complex tree models.

The complex data relationships among process parameters and variables can be univariate or multivariate or both. By providing an analytical framework from which to better evaluate the various parameters and variables as representative of die level performance, consistently better yield performance overall can result. From the complex data relationships, the relevant input parameters for each die may be implicitly imputed by the model specific to that die.

The processor-based models could be desktop-based, i.e., standalone, or part of a networked system; but given the heavy loads of information to be processed and displayed with some interactivity, processor capabilities (CPU, RAM, etc.) should be current state-of-the-art to maximize effectiveness. In the semiconductor foundry environment, the Exensio® analytics platform is a useful choice for building GUI templates. In one embodiment, coding of the processing routines may be done using Spotfire® analytics software version 7.11 or above, which is compatible with Python object-oriented programming language, used primarily for coding machine language models.

The key is to learn and understand the complex non-linear relationships required to implicitly impute each PCM parameter for each die. This imputation is driven by the yield of the die so that the imputed PCM value may be implicitly predicted, since there is insufficient PCM data to explicitly predict each PCM value. Regardless of whether an implicit or explicit imputation form is chosen for the model, the accuracy is clearly demonstrated by the correlation between predicted and actual yield at the lot, wafer, and die levels, as shown in the figures.

FIG. 1 is a wafer level scatter plot 100 of predicted yield versus actual yield for a large number of wafers across multiple lots, with the linear correlation between predicted and actual yield shown as line 120. The linear correlation of predicted and actual yield has a cross-validated r-squared value of 0.561, indicating a correlation on average for all wafers of about 56% of predicted yield to actual yield.

A number of individual wafers labeled 101-109 are specifically referenced here and in the figures for illustrative purposes. For example, according to the wafer-level correlation shown in FIG. 1, wafer 103 has a relatively low correlation between predicted and actual yield, while wafers 102 and 109 have relatively high correlation between predicted and actual yield.

Figure 2:
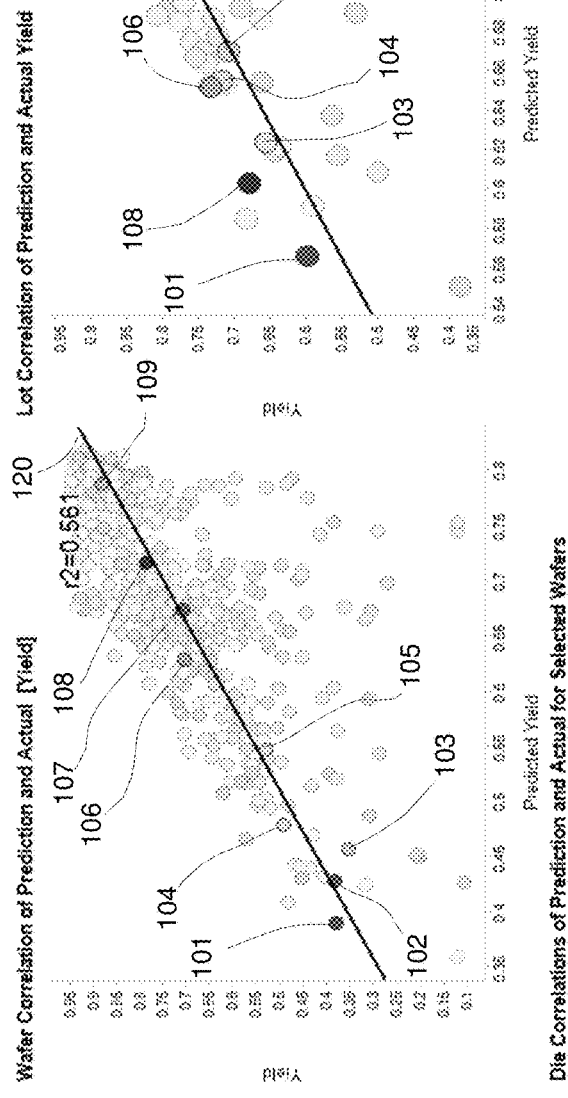
FIG. 2 is a graphical plot illustrating a lot-level correlation between predicted yield and actual yield for the plurality of wafer samples of FIG. 1.

Referring to FIG. 2, a lot-level scatter plot 200 of the same wafers helps to drill down and provide additional input to the die-level model, illustrating additional variances at the lot level.

Since yield is a binary variable with a value of 0 for a failing die and a value of 1 for a passing die and the prediction is a number between 0 and 1 indicating the probability that the die will be yielding, it is more useful to compare the predicted yield with the average actual yield of each die and the die immediately adjacent to it. This is referred to as smoothing and the actual yield and predicted yield in all figures have been smoothed using this method.

Figure 3:
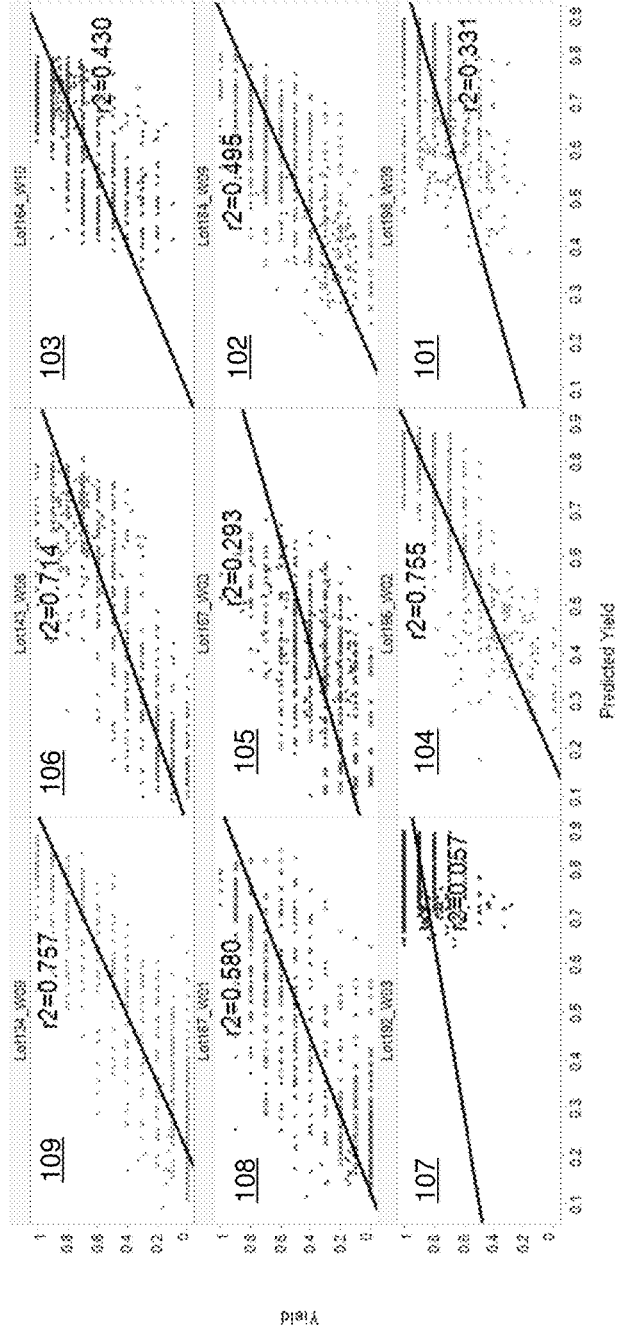
FIG. 3 is a series of graphical plots illustrating die-level correlations between predicted yield and actual yield for a plurality of wafer lots.

The die-level correlations of predicted smoothed yield versus actual smoothed yield are shown in the series of plots in FIG. 3, which correspond to the 9 sample wafers 101-109. For example, the die correlation for wafer 109 has an average r-squared value of 0.757, indicating approximately 76% correlation between predicted and actual yield for the dies on this wafer; the die correlation for wafer 108 has an average r-squared value of 0.580, indicating approximately 58% correlation between predicted and actual yield for the dies on this wafer; the die correlation for wafer 107 has an average r-squared value of 0.057, indicating approximately 6% correlation between predicted and actual yield for the dies on this wafer; the die correlation for wafer 106 has an average r-squared value of 0.714, indicating approximately 71% correlation between predicted and actual yield for the dies on this wafer; the die correlation for wafer 105 has an average r-squared value of 0.293, indicating approximately 29% correlation between predicted and actual yield for the dies on this wafer; the die correlation for wafer 104 has an average r-squared value of 0.755, indicating approximately 76% correlation between predicted and actual yield for the dies on this wafer; the die correlation for wafer 103 has an average r-squared value of 0.430, indicating approximately 43% correlation between predicted and actual yield for the dies on this wafer; the die correlation for wafer 102 has an average r-squared value of 0.495, indicating approximately 50% correlation between predicted and actual yield for the dies on this wafer; and finally, the die correlation for wafer 101 has an average r-squared value of 0.331, indicating approximately 33% correlation between predicted and actual yield for the dies on this wafer.

Figure 4:
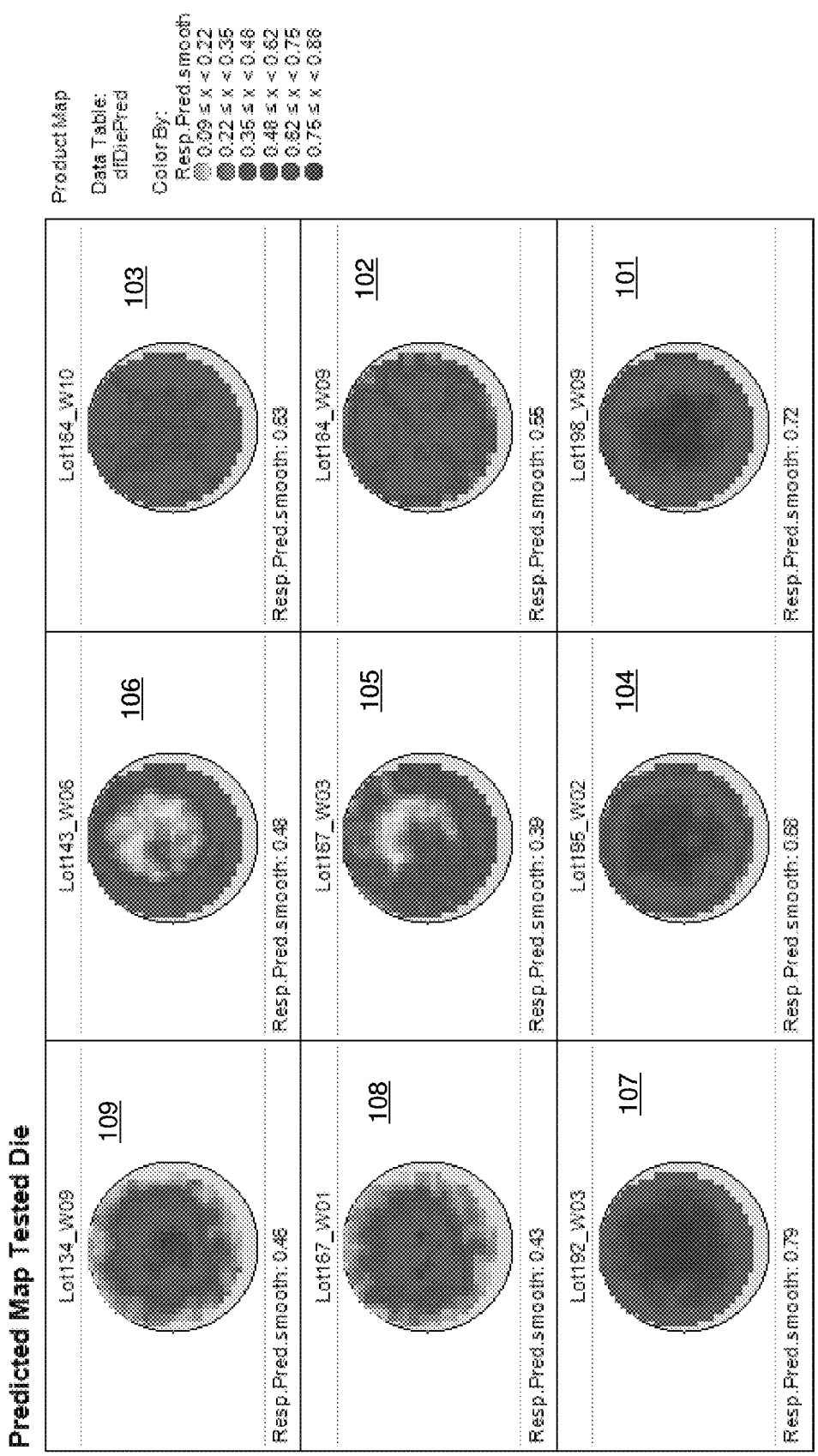
FIG. 4 is a series of heat maps illustrating predicted spatial patterns for the wafer lots shown in FIG. 3.
Figure 5:
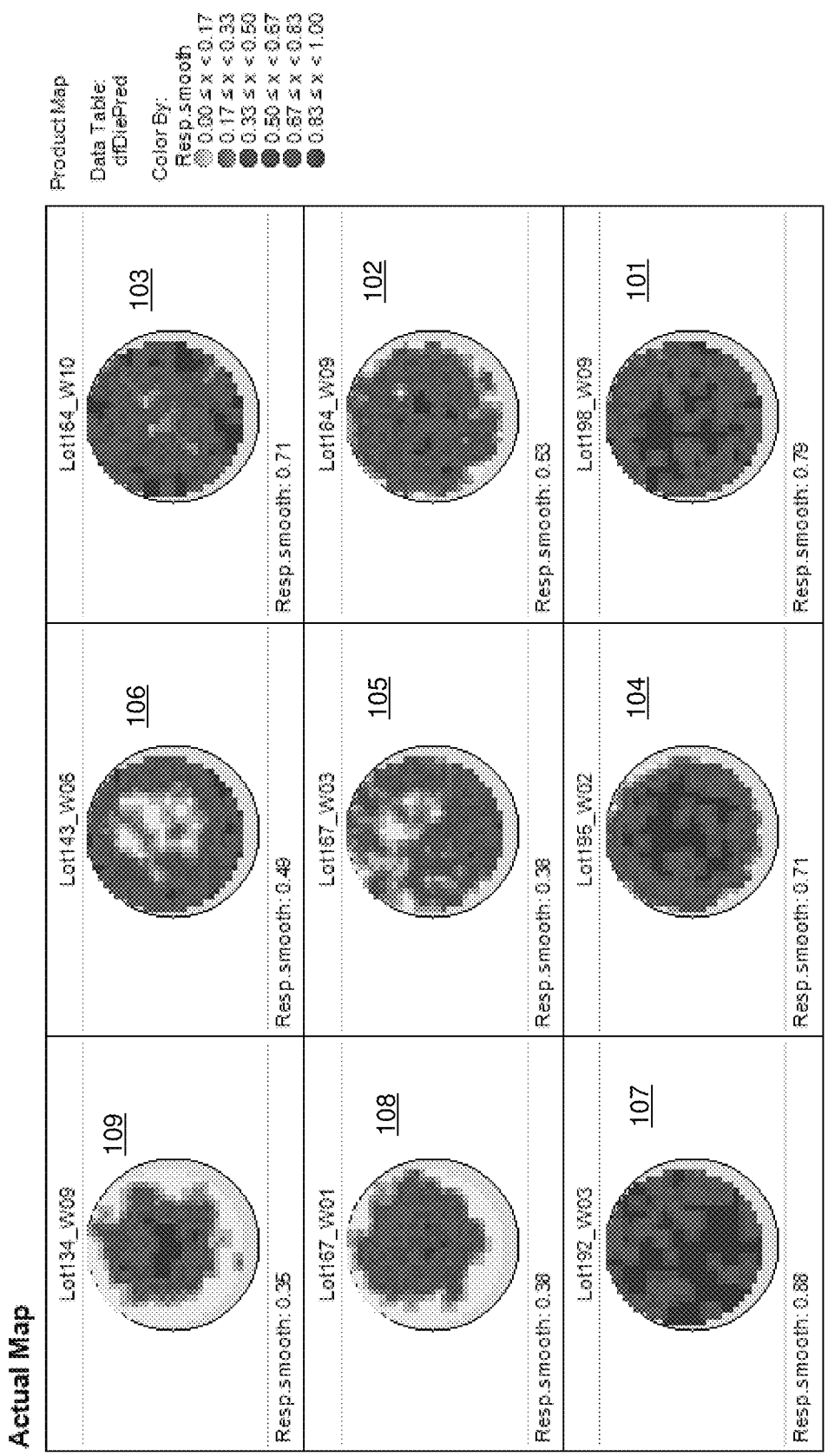
FIG. 5 is a series of heat maps illustrating actual spatial patterns for the wafer lots shown in FIG. 3 and predicted in FIG. 4.

These conclusions can be further confirmed by looking at the spatial correlations for the die models, as shown for wafers 101-109 in the predicted heat maps of FIG. 4 and the actual heat maps of FIG. 5. Even where yield results are lower, the models predict the final maps fairly well. The visual similarity of the wafer maps for wafers 103, 104, 105, 106, 108, and 109 are obvious. Wafers 101 and 107 are very different visually and the correlation plots in FIG. 3 show that these wafers have low values for spatial r-squared.

Figure 6:
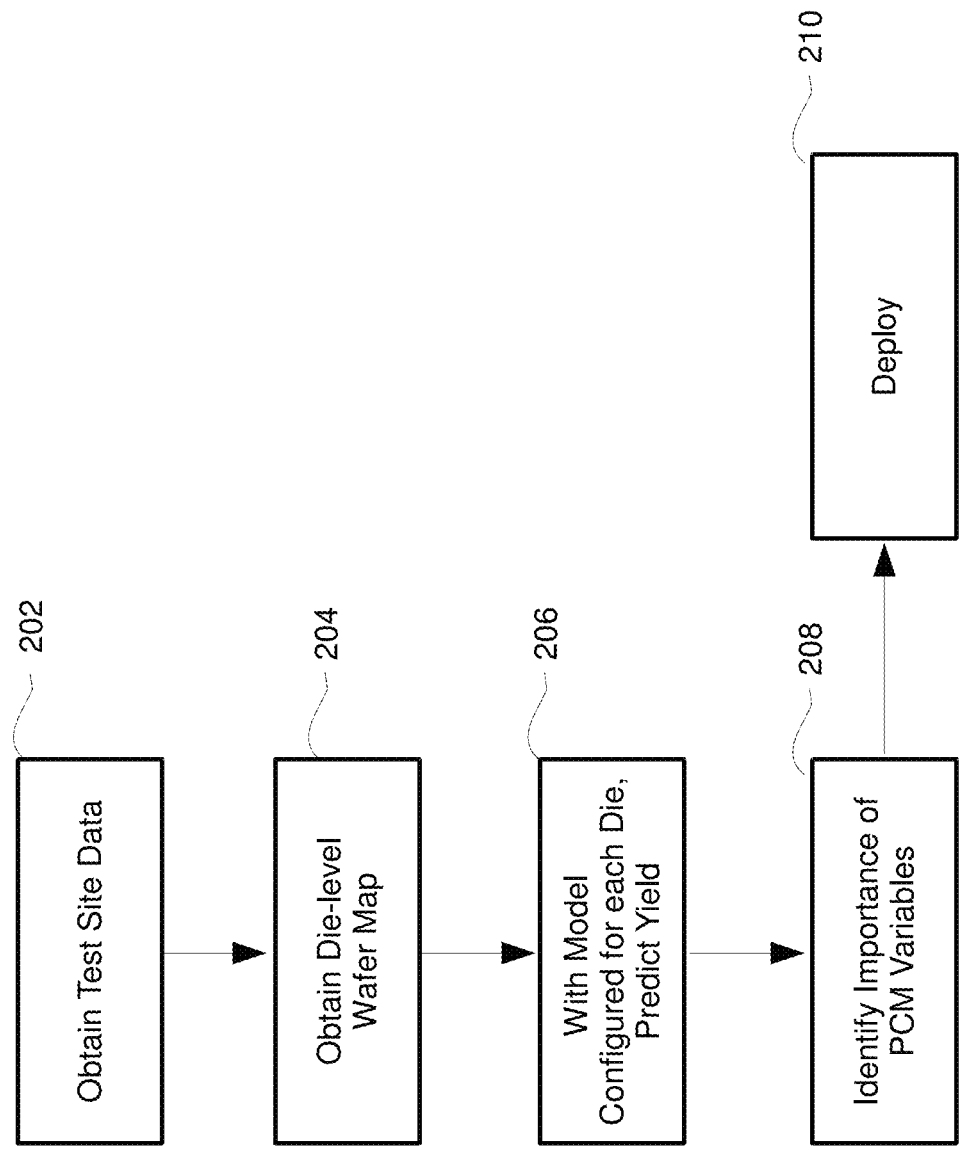
FIG. 6 is a flow chart of a general process for determining die-level values for process control parameters.

The concept is really a mapping of inputs to outputs, but based on the analysis of the complex relationship of the inputs to the desired outputs, in the primary case, yield. FIG. 6 is a flow chart illustrating a simple method for making die-level predictions of yield. In step 202, input data is acquired from each of the test sites formed across the wafer. In step 204, a die level map of the wafer is obtained, providing graphical details of features and locations. In step 206, for each die on the wafer, a machine learning model configured for the individual die predicts yield for that die based on the testing input data from all of the test sites. The implicit imputation of features is primarily driven by the yield performance, and the discovery of the inter-relationships between the input data from the entirety of the test sites on a single wafer and individual dies, learned and continuously updated by the machine learning model, establishes the correspondence to PCM values for individual die features. In optional step 208, the model can help to identify the relative importance of particular PCM variables to yield. Finally, in step 210, the models are deployed for use in evaluating spatial patterns for yield. Using the product yield and wafer sort parametric measurements as the intended response for the model allows PCM parameters for an individual die to be implicitly imputed, in particular, for modeling outlier spatial patterns.

In addition to imputing PCM values at multiple sites, this same technique can be used to incorporate other site level data, such as metrology and wafer level data such as tool, chamber, hold time, failure indicators, etc.

Thus, machine learning models can be configured to impute, for each die, the expected process control parameters based on wafer sort parametric measurements at multiple test sites across the entire wafer, as well as yield results for that wafer. This allows for a better analysis of outlier spatial patterns leading to improved yield results.

The invention claimed is:
1. A method, comprising:
   obtaining testing data from each of a respective plurality of test sites formed and distributed across a semiconductor wafer, prior to slicing a multiplicity of dies from the wafer;

obtaining a die level map of the semiconductor wafer that includes graphical details regarding a multiplicity of semiconductor features and corresponding locations for each feature on the semiconductor wafer; and for each of the multiplicity of dies on the semiconductor wafer:
provinding the testing data and the die level map as input data to a multiplicity of neural networks, each neural network corresponding to a respective one of the multiplicity of dies and each neural network programmed with instructions to (i) determine non-linear relationships among the input data for the respective die, (ii) impute from the determined non-linear relationship among the input data a plurality of input process parameters relevant to the respective die, and (iii) predict yield for the respective die from the imputed input process parameters, wherein each neural network is initially configured from training sets of input data.

2. The method of claim 1, further comprising:
identifying by the neural network a relative importance of each of the multiplicity of process parameters to the yield prediction for the respective die.

3. A method, comprising:
obtaining testing data for a plurality of process control parameters from a plurality of test sites formed on and distributed across a semiconductor wafer, the testing data obtained prior to slicing a multiplicity of dies from the wafer;

obtaining a die level map of the semiconductor wafer, the map including graphical details regarding a multiplicity of semiconductor features formed on each die and corresponding locations on the wafer for each of the multiplicity of features;

providing the testing data and the die level map as input data to a multiplicity of neural networks, each one of the multiplicity of neural networks corresponding to a respective one of the multiplicity of dies, wherein each of the multiplicity of neural networks is programmed with instructions to learn and identify non-linear relationships between each of the plurality of process control parameters and yield performance on the basis of the testing data and the die level map, and to impute each of the plurality of process control parameters for each respective die on the basis of the determined non-linear relationships, each of the multiplicity of neural networks is initially configured from training sets of input data; and deploying the method into a semiconductor processing environment.

4. The method of claim 3, further comprising:
each neural network is configured to determine the correspondence between individual ones of the process control parameters and individual ones of the semiconductor features.

5. The method of claim 3, wherein each neural network is initially configured on the basis of training sets of input data.

6. The method of claim 3, wherein each neural network is continuously updated from newly acquired sets of input data from the semiconductor processing environment to continuously learn and identify the non-linear relationships.

7. The method of claim 3, further comprising evaluating spatial patterns on die level maps for correspondence to yield performance.

8. The method of claim 7, further comprising modeling outlier spatial patterns based on the imputed process control parameters.

9. The method of claim 3, further comprising:
forming at least some of the plurality of test sites on a plurality of scribe lines located between the dies on the wafer for indicating where to slice the dies.

10. The method of claim 3, further comprising:
forming at least some of the plurality of test sites near edges of the wafer.

11. A non-transitory computer-readable medium having instructions which, when executed by a processor, cause the processor to:
obtain testing data for a plurality of process control parameters from a plurality of test sites formed on and distributed across a semiconductor wafer, the testing data obtained prior to slicing a multiplicity of dies from the wafer;

obtain a die level map of the semiconductor wafer, the map including graphical details regarding a multiplicity of semiconductor features formed on each die and corresponding locations on the wafer for each of the multiplicity of features; and provide the testing data and the die level map as input data to a multiplicity of neural networks, each one of the multiplicity of neural networks corresponding to a respective one of the multiplicity of dies, wherein each of the multiplicity of neural networks is programmed with instructions to learn and identify non-linear relationships between each of the plurality of process control parameters and yield performance on the basis of the testing data and the die level map, and to impute each of the plurality of process control parameters for each respective die on the basis of the determined non-linear relationships, each of the multiplicity of neural networks is initially configured from training sets of input data.

12. A method, comprising:
obtaining testing data for a plurality of process control parameters from a plurality of test sites formed on and distributed across a semiconductor wafer, the testing data obtained prior to slicing a multiplicity of dies from the wafer;

obtaining a die level map of the semiconductor wafer, the map including graphical details regarding a multiplicity of semiconductor features formed on each die and corresponding locations on the wafer for each of the multiplicity of features;

providing the testing data and the die level map as input data to a multiplicity of machine learning tree models, each one of the multiplicity of machine learning tree models corresponding to a respective one of the multiplicity of dies; and wherein each of the multiplicity of machine learning tree models is programmed with instructions to learn non-linear relationships between each of the plurality of process control parameters and yield performance on the basis of the testing data and the die level map, and to impute each of the plurality of process control parameters for each respective die on the basis of the determined non-linear relationships, each of the multiplicity of machine learning tree models is initially configured from training sets of input data.

* * * * *